(12) United States Patent
Derat

(10) Patent No.: US 11,637,382 B2
(45) Date of Patent: Apr. 25, 2023

(54) METHOD FOR MANUFACTURING AN ANTENNA ARRAY, ANTENNA ARRAY, AND TEST SYSTEM

(71) Applicant: Rohde & Schwarz GmbH & Co. KG, Munich (DE)

(72) Inventor: Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/366,683

(22) Filed: Jul. 2, 2021

(65) Prior Publication Data

US 2022/0037799 A1  Feb. 3, 2022

(30) Foreign Application Priority Data

Aug. 3, 2020 (EP) .................................. 20189131

(51) Int. Cl.
*G01R 29/10* (2006.01)
*H01Q 21/00* (2006.01)

(52) U.S. Cl.
CPC .......... *H01Q 21/0087* (2013.01); *G01R 29/10* (2013.01)

(58) Field of Classification Search
CPC .... H01Q 21/0087; H01Q 21/00; G01R 29/10; G01R 29/0814; G01R 29/0878; G01R 21/002; G01R 23/16; G01R 29/12; G06F 17/141
See application file for complete search history.

(56) References Cited

U.S. PATENT DOCUMENTS

| 9,742,073 B2 * | 8/2017 | Capozzoli | ............. H01Q 15/14 |
| 2019/0356397 A1 * | 11/2019 | DaSilva | ................. H04B 17/17 |

FOREIGN PATENT DOCUMENTS

| CN | 109004970 A | 12/2018 | |
| CN | 109037920 A | 12/2018 | |
| EP | 2315312 A1 * | 4/2011 | ............. H01Q 21/06 |
| EP | 3306327 A1 * | 4/2018 | ............. G01R 29/10 |
| EP | 3306327 A1 | 4/2018 | |
| JP | 2005136542 A * | 5/2005 | |

(Continued)

OTHER PUBLICATIONS

Salmon, Near-field Aperture Synthesis Millimeter Wave Imaging for Security Screening of Personnel, 2014, 9th International Symposium on Communication Systems, Networks & Digital Sign (Year: 2014).*

(Continued)

*Primary Examiner* — Ab Salam Alkassim, Jr.
*Assistant Examiner* — Anh N Ho
(74) *Attorney, Agent, or Firm* — Christensen O'Connor Johnson Kindness PLLC

(57) ABSTRACT

A method of manufacturing an antenna array is described. The method includes: providing several antennas; determining at least one set of quasi-random positions for the antennas based on a predefined algorithm for limiting aliasing effects, wherein the positions are arranged on a manifold having at least one dimension in an irregular manner; and arranging the antennas according to the at least one set of quasi-random positions obtained from the predefined algorithm for limiting aliasing effects. Further, an antenna array and a test system are described.

13 Claims, 2 Drawing Sheets

(56) References Cited

FOREIGN PATENT DOCUMENTS

JP         2005136542 A      5/2005

OTHER PUBLICATIONS

JinPing et al., A novel spaceborne SAR wide-swath imaging approach based on Poisson disk-like nonuniform sampling and compressive sensing, 2012, Science China Information Sciences, vol. 55. No. 8: 1876-1887 (Year: 2012).*
Fakharian et al, Monte Carlo simulation for stochastic calculus of far-field radiation from open-ended waveguide arrays, 2016, International Journal of Numerical Modelling: Electronic Networks, Devices and Fields Int. J. Numer. Model. 2016; 29:1015-1023 (Year: 2016).*
Alavi, Near-Field to Far-Field Transformation and Fault Detection Using Adaptive Sampling and Machine Learning in Source Reconstruction Method, 2019 (Year: 2019).*
Rezaei et al, Analysis of Far-Field Radiation from Apertures Using Monte Carlo Integration Technique, 2013, Majlesi Journal of Electrical Engineering, vol. 7, No. 3 (Year: 2013).*
Poljak et al, Human Interaction with Electromagnetic Fields, 2019, Science Direct (Year: 2019).*
Poordaraee, M. et al., "Plane Wave Synthesis with Irregular Chamber Planar Antenna Arrays for Compact OTA Measurements," 13th European Conference on Antennas and Propagation (EuCAP 2019), 5 pages.
Salmon, N.A., "Near-field Aperture Synthesis Millimeter Wave Imaging for Security Screening of Personnel," 2014 9th International Symposium on Communication Systems, Networks & Digital Sign (CSNDSP), IEEE, pp. 1082-1085.

* cited by examiner

METHOD FOR MANUFACTURING AN ANTENNA ARRAY, ANTENNA ARRAY, AND TEST SYSTEM

FIELD OF THE DISCLOSURE

Embodiments of the present disclosure generally relate to a method of manufacturing an antenna array. Embodiments of the present disclosure further relate to an antenna array and to a test system.

BACKGROUND

Increasing the size of a quiet zone is a key problem in many over-the-air (OTA) measurement applications. One technique that can be used in order to increase the size of the quiet zone is the so-called plane-wave synthesis.

This technique requires using an antenna array with multiple antennas in order to create a plane-like wave front. Such antenna arrays are often called "plane wave converters".

Optimizing the number of antennas used in the antenna array or rather in the plane wave converter is an important factor in order to reduce the cost, the complexity, and the size of the antenna array.

SUMMARY

Embodiments of the present disclosure provide a method of manufacturing an antenna array. In an embodiment, the method comprises the following steps:

providing several antennas;

determining at least one set of quasi-random positions for the antennas based on a predefined algorithm for limiting aliasing effects, wherein the positions are arranged on a manifold having at least one dimension in an irregular manner; and arranging the antennas according to the at least one set of quasi-random positions obtained from the predefined algorithm for limiting aliasing effects.

In some embodiments, the manifold may be established as a one-dimensional manifold or as a two-dimensional manifold. For example, the manifold may be a straight line, a curved line, a bumpy surface, a flat surface, a curved surface, or a bumpy surface.

The antenna array may be established, for example, as a plane wave converter being configured to measure electromagnetic waves in a (radiating) near-field area of a device under test. The measurements done by the plane waveconverter can be used in order to deduce far-field properties of the electromagnetic waves generated by the device under test.

Similarly, the antenna array may generate electromagnetic waves that, at least in a quiet zone that is located at the device under test, exhibit far-field properties, in spite of the antenna array being arranged in the (radiating) near field of the device under test.

Conventional methods for manufacturing such antenna arrays employ algorithms that place the antennas on a rectangular grid, i.e., the individual antennas are positioned at equidistant grid points. However, this approach may suffer from aliasing effects that occur when the far-field properties of the electromagnetic waves are determined based on measured near-field properties.

According to the present disclosure, an algorithm for limiting aliasing effects is employed, which determines the set of quasi-random positions for the antennas.

Accordingly, there are no fixed positions for the antennas on a grid. Instead, the respective position of the individual antennas is quasi-random, which means that the antennas may be located at random positions, but with a predefined minimum distance from each other.

It has been discovered that aliasing effects are significantly reduced by placing the antennas in an irregular fashion, for example in a quasi-random fashion.

Moreover, it has been discovered that less antennas are required for an antenna array arranged (e.g., individual positions of the antennas) according to methods of the disclosure compared to the grid-like arrangement of the antennas. In some embodiments, the total number of antennas may be reduced by up to 60% without sacrificing measurement accuracy. Thus, the manufacturing costs for the antenna array are reduced significantly.

According to an aspect of the present disclosure, the predefined algorithm is established as a blue noise sampling algorithm, a Poisson disc sampling algorithm and/or as a low discrepancy sampling algorithm. Accordingly, the algorithm for reducing aliasing effects is configured to determine "random" positions for the antennas, but with a predefined minimum distance from each other, i.e., the quasi-random positions. Of course, any other suitable algorithm currently known or developed in the future may be employed in order to determine the quasi-random positions.

According to another aspect of the present disclosure, the manifold is established as a line having a predetermined length or as a portion of a plane having a predefined area. In some embodiments, the line or the plane extends perpendicularly to a desired main reception/transmission direction of the antenna array. Thus, measurement samples that are associated with a plane wave spectrum of electromagnetic waves received by the antenna array can be taken by the antenna array.

In a further embodiment of the present disclosure, several sets of quasi-random positions are determined based on the predefined algorithm for limiting aliasing effects, wherein one of the several sets of quasi-random positions is selected based on at least one predefined criterion. In other words, the several sets of quasi-random positions may be compared with each other based on the at least one pre-defined criterion, and one of the sets may be selected based on the comparison. The antennas are then arranged based on the selected set of quasi-random positions.

By generating and comparing several sets with each other, wanted properties of the antenna array, e.g., with respect to a main reception/transmission direction, can be improved, for example optimized.

According to another aspect of the present disclosure, the sets of quasi-random positions are respectively transformed into spatial frequency domain, thereby obtaining a spatial spectrum for each of the sets of quasi-random positions, in order to select one of the several sets of quasi-random positions. For example, a discrete Fourier transform of each set of quasi-random positions is performed with respect to the one or two coordinates of the one- or two-dimensional manifold, respectively.

In general, each spatial spectrum comprises information on the behavior of the antenna array having that particular set of quasi-random positions of the antennas with respect to electromagnetic waves generated by the device under test. Thus, a specific set of quasi-random positions having desired properties can be chosen based on a comparison of the spatial spectra.

In some embodiments, the predefined criterion comprises a width of a center peak of the spatial spectrum and/or a height of side peaks of the spatial spectrum. Generally, the width of the center peak and the height of the side peaks comprises information on the main reception/transmission direction of the antenna array. For example, the antenna array may be used in order to analyze plane waves propagating along the z-direction, which corresponds to electromagnetic waves having $k_x=k_y=0$. Accordingly, the set of quasi-random positions having a spatial spectrum with a small peak at $k_x=0$ and $k_y=0$, and/or small side peaks at larger values of $k_x$, $k_y$ may be chosen for that purpose.

The antennas may be arranged, for example, such that the antennas have a common main transmission direction and/or a common main reception direction. In some embodiments, the common reception/transmission direction may be a direction being perpendicular to the antenna array. For example, the antenna array may extend in an x-y-plane, while the main reception/transmission direction is along the z-axis.

According to another aspect of the present disclosure, a total number of the antennas is predetermined. Accordingly, the reception properties and/or the transmission properties of the antenna array are optimized for the predetermined number of antennas. For example, the predefined number of antennas may be a certain fraction of the corresponding number of antennas used for a plane wave converter in the state of the art, e.g., 80% or 60% of the corresponding number of antennas used for a plane wave converter in the state of the art.

Embodiments of the present disclosure further provide an antenna array with several antennas. The antenna array is manufactured via one or more methods described above.

Regarding the advantages and further properties of the antenna array, reference is made to the explanations given above with respect to the method, which also hold for the antenna array and vice versa.

In some embodiments, the antenna array is established as a plane wave converter. Embodiments of the present disclosure further provide a test system with a device under test, an antenna array described above, and an analysis circuit. The device under test is configured to transmit electromagnetic waves. The antenna array is arranged in a near-field area of the device under test. The antenna array is configured to take a set of sample measurements of the electromagnetic waves transmitted by the device under test via the individual antennas of the antenna array. The analysis circuit is configured to determine at least one far-field quantity of the electromagnetic waves generated by the device under test based on the set of sample measurements.

Regarding the advantages and further properties of the test system, reference is made to the explanations given above with respect to the method, which also hold for the test system and vice versa.

In some embodiments, the antenna array is arranged in a radiating near-field area of the device under test.

According to an aspect of the present disclosure, the analysis circuit is configured to determine the at least one far-field quantity based on a quasi-Monte Carlo method. Therein, the set of sample measurements taken by the antennas of the antenna array serve as a set of samples for the quasi-Monte Carlo method in order to determine the at least one far-field quantity. As the positions of the antennas are quasi-random, the set of measurement samples is taken at quasi-random positions. Accordingly, aliasing effects that may occur in the determined far-field quantity are reduced compared to a grid-like arrangement of the antennas.

According to another aspect of the present disclosure, the analysis circuit is configured to determine the at least one far-field quantity based on a quasi-Monte Carlo method that is applied to a plane wave spectrum of the device under test in the near-field area of the device under test. In other words, the set of sample measurements taken by the individual antennas may be used in order to determine a plane wave spectrum of the device under test in the (radiating) near-field area of the device under test. The analysis circuit may be configured to determine the at least one far-field quantity based on the determined plane wave spectrum.

In a further embodiment of the present disclosure, the analysis circuit is configured to determine the at least one far-field quantity based on a quasi-Monte Carlo integration method that is applied to an integral of an electric field strength of the electromagnetic waves over an area of the antenna array. In other words, the set of sample measurements taken by the individual antennas may be used in order to calculate the integral of the electric field strength in the area of the antenna array, i.e. in the (radiating) near-field area of the device under test, via a quasi-Monte Carlo integration technique. The analysis circuit may be configured to determine the at least one far-field quantity based on the determined value of the integral.

In some embodiments, the analysis circuit is configured to determine the plane wave spectrum of the device under test in the near-field area of the device under test based on the integral.

According to another aspect of the present disclosure, the at least one far-field quantity comprises an effective radiated power. In other words, the analysis circuit is configured to determine the effective radiated power of the device under test based on the set of sample measurements in the (radiating) near-field area of the device under test. In some embodiments, the analysis circuit is configured to determine the effective radiated power of the device under test based on the plane wave spectrum of the device under test in the (radiating) near-field area of the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
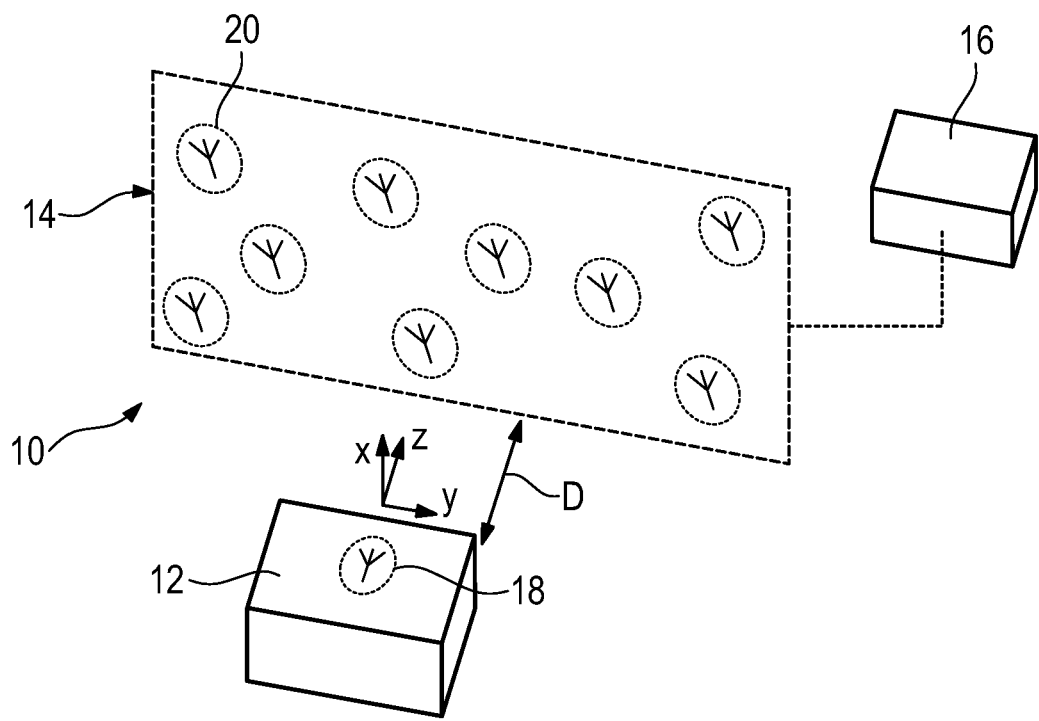
FIG. 1 schematically shows a test system according to an embodiment of the present disclosure.

FIG. 1 schematically shows a test system 10 comprising a device under test 12, an antenna array 14, and an analysis circuit 16. In general, the device under test 12 is configured to generate and/or receive electromagnet waves having a predetermined frequency or a predetermined frequency range. It is noted that the device under test 12 is illustrated only abstractly in FIG. 1, as the device under test 12 may actually be established as one of several different types of electronic devices.

In some embodiments, the term "circuit" refers to or includes, inter alia, a combination of hardware (e.g., a processor such as an integrated circuit, digital circuits, or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

In general, the device under test 12 is configured to generate and/or receive electromagnet waves having a predetermined frequency or a predetermined frequency range. For example, the device under test 12 comprises at least one antenna 18 that is configured to transmit and/or receive electromagnetic waves having at least one predefined frequency or a predefined frequency spectrum. In some embodiments, the at least one predefined frequency spectrum comprises at least one frequency band between 300 MHz and 10 GHz.

For example, the device under test 12 may be established as a mobile communication device that is configured for communication according to the 3G, 4G, 5G or 5G-NR ("New Radio") communication standard. In some embodiments, the device under test 12 may be established as a base station that is configured for communication according to the 3G, 4G, 5G or 5G-NR communication standard.

In some embodiments, the antenna array 14 has a distance D to the device under test 12 in z-direction, and extends perpendicular to the z-axis. Accordingly, the antenna array 14 is plate-like shaped as it has a thickness in z-direction that can be neglected compared to the size of the antenna array 14 in x-direction and y-direction. The distance D is such that the antenna array 14 is arranged in a near-field area of the device under test 12, more precisely in a radiating near field area of the device under test 12.

The antenna array 14 comprises several antennas 20 that are configured to transmit and/or receive electromagnetic waves in at least one predefined frequency band. In some embodiments, the antennas 20 are configured to transmit and/or receive electromagnetic waves in the same frequency band as the at least one antenna 18 of the device under test 12.

In some embodiments, the analysis circuit 16 may be part of or established by an oscilloscope, a spectrum analyzer, and/or a (vector) signal analyzer. The signal analysis circuit 16 is connected to the antenna array 14, for example to the individual antennas 20 of the antenna array 14, in a signal transmitting manner. Accordingly, the device under test 12 may generate a signal by the at least one antenna 18. The signal is received via the individual antennas 20 of the antenna array 14. The antennas 20 generate corresponding input signals, which are then forwarded to the analysis circuit 16.

Generally, the test system 10 is configured to measure the electromagnetic waves generated by the device under test 12 in the (radiating) near-field of the device under test 12. The test system 10, via the analysis circuit 16, is configured to determine at least one far-field quantity being associated with the electromagnetic waves generated by the device under test 12 based on the near-field measurements. In other words, the antenna array 14 is established, for example, as a plane wave converter.

However, there are several differences between the test system 10 shown in FIG. 1 and comparable test systems known in the state of the art, which will be explained in the following.

A first difference concerns the way the antenna array 14 is manufactured, and for example the placement or rather the locations of the individual antennas 20 of the antenna array 14. This is explained in the following with reference to FIG. 2, which shows a flow chart of a representative method of manufacturing the antenna array 14.

Figure 2:
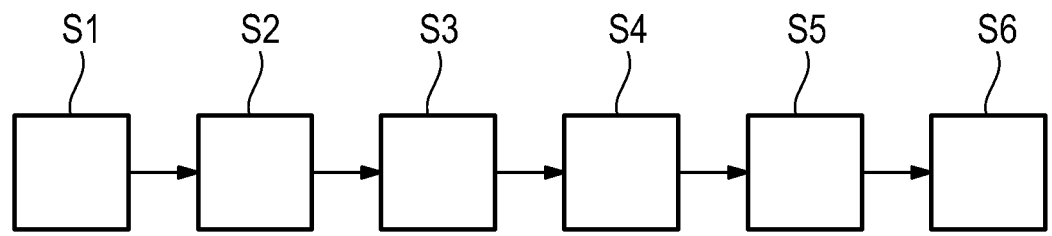
FIG. 2 shows a flow chart of a method of manufacturing an antenna array according to an embodiment of the present disclosure.

According to FIG. 2, the several antennas 20 are provided (step S1). In some embodiments, a predetermined number of antennas 20 is provided, and the steps described below are performed based on the predetermined number of antennas 20.

Several sets of quasi-random positions for the antennas 20 are determined by an algorithm for limiting aliasing effects (step S2). Each set of quasi-random positions is arranged on the same manifold, wherein the manifold is at least a one-dimensional one. In some embodiments, the manifold is established as a one-dimensional manifold or as a two-dimensional manifold. For example, the manifold may be a straight line, a curved line, a bumpy surface, a flat surface, a curved surface, or a bumpy surface.

Figure 3:
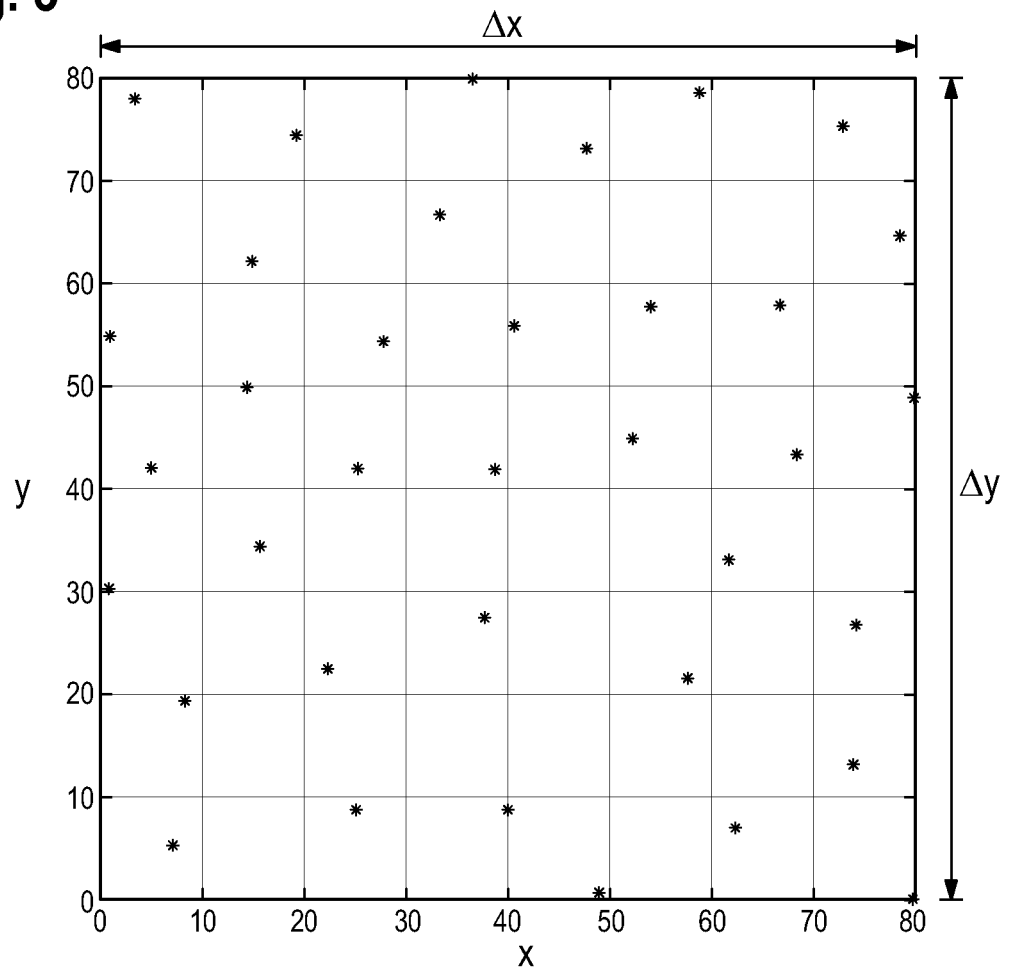
FIG. 3 shows a representative diagram of a set of quasi-random positions.

In the following, step S2 is illustrated in more detail with reference to FIG. 3, which shows an exemplary set of quasi-random positions (marked by stars), wherein the manifold is a flat surface in an x-y-plane at z=D. For example, the manifold is a portion of the x-y-plane at z=D having a predefined area $A=\Delta x \cdot \Delta y$.

In general, the positions of the antennas 20 are not fixed to a grid, as would be the case in the state of the art. Instead, an algorithm for reducing aliasing effects is used that is configured to determine "random" positions for the antennas 20, but with a predefined minimum distance from each other, i.e. the quasi-random positions. For example, the algorithm may be established as a blue noise sampling algorithm, a Poisson disc sampling algorithm and/or as a low discrepancy sampling algorithm.

Each set of quasi-random positions is transformed to spatial frequency domain, thereby obtaining a spatial spectrum for each set of quasi-random positions (step S3).

Optionally, it is assumed that the antennas 20 each emit a (simulated) reference signal at their quasi-random positions, wherein the (simulated) reference signals are transformed to spatial frequency domain for further evaluation. For example, a discrete Fourier transform of each set of quasi-random positions is performed with respect to the x-coordinate and with respect to the y-coordinate.

The spatial spectra being associated with the individual sets of quasi-random positions are compared with each other based on at least one predefined criterion (step S4). The at least one predefined criterion relates to a width of a center peak of the spatial spectrum and/or to a height of side peaks of the spatial spectrum.

Figure 4:
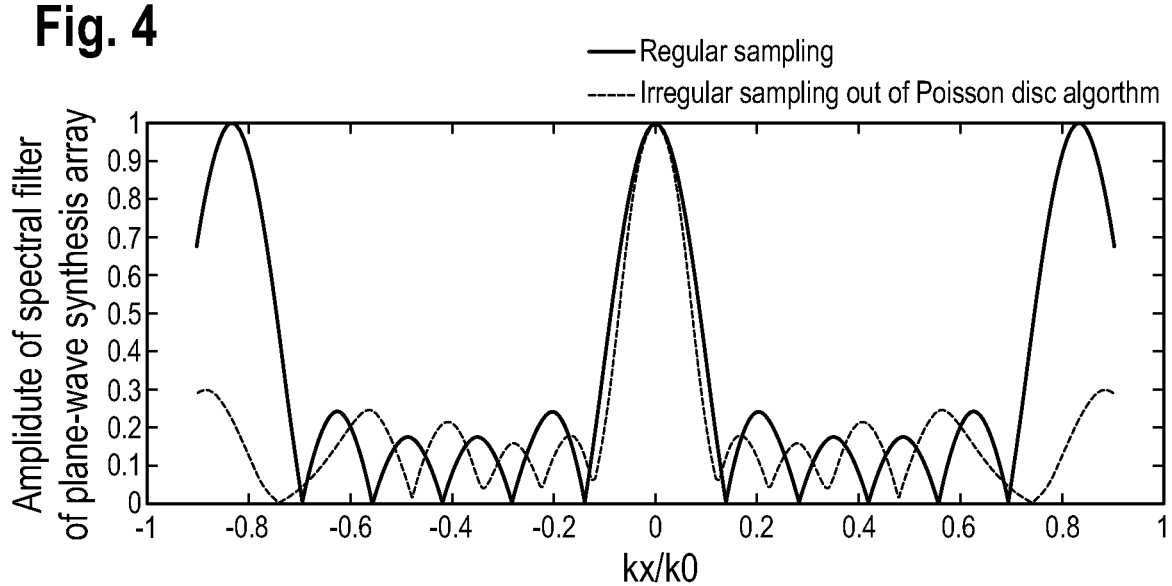
FIG. 4 shows a representative diagram of a Fourier transform of the set of quasi-random positions of FIG. 3.

This is illustrated in FIG. 4, which shows a comparison of a spectrum of a usual grid-like arrangement of the antennas 20 with a spectrum of the set of quasi-random positions determined and chosen according to the steps described above.

As can clearly be seen, the spectrum of the set of quasi-random positions generated by the algorithm for reducing aliasing effects (Poisson disc sampling algorithm in the example of FIG. 4) exhibits a narrower peak at the center and lower side peaks compared to the spectrum of the grid-like positions ("regular sampling" in FIG. 4).

It is noted that only the $k_x$-coordinate is shown in FIG. 4 for illustrating purposes, which corresponds to the x-coordinate in space domain. Of course, the spatial spectrum is actually two-dimensional, i.e., the spatial spectrum is a function of $k_x$ and $k_y$, wherein $k_y$ corresponds to the y-coordinate in space domain.

In FIG. 4, the $k_x$-axis is normalized by $k_0=2\pi/\lambda$, wherein $\lambda$ is the wavelength of the electromagnetic waves generated by the device under test 12.

Accordingly, the spatial spectrum comprises information on the behavior of the antenna array 14 having that particular set of quasi-random positions of the antennas 20 with respect to electromagnetic waves generated by the device under test 12.

As will be described in more detail below, the antenna array 14 can be used in order to analyze plane waves propagating along the z-direction, which corresponds to electromagnetic waves having $k_x=k_y=0$.

One of the several sets of quasi-random positions is chosen based on the predefined criterion (step S5). In some embodiments, as electromagnetic waves propagating in the z-direction are to be analyzed, the set having a spectrum with a narrow center peak and/or with low side peaks is chosen.

The antennas 20 then are arranged according to the chosen set of quasi-random positions (step S6).

In some embodiments, the antennas 20 are arranged such that they have a common main reception direction, and thus a common main transmission direction, namely the z-direction.

Summarizing, the antennas 20 of the antenna array 14 are arranged by the algorithm for reducing aliasing effects in an irregular fashion, for example in a quasi-random fashion. The spatial spectrum of the positions of the antennas 20 in the x-y-plane is optimized such that the antenna array 14 is particularly suitable for analyzing electromagnetic waves propagating in the z-direction, for example plane waves propagating in the z-direction.

The method described above may also be used for optimizing the arrangement of the antennas 20 when the total number of antennas 20 is fixed.

It has been discovered that the total number of antennas 20 can be reduced by up to 60% using methods of the disclosure when compared to a grid-like arrangement of the antennas 20 without sacrificing measurement accuracy.

As already mentioned above, the test system 10 is configured to measure the electromagnetic waves generated by the device under test 12 in the (radiating) near-field of the device under test 12 via the antennas 20, and to determine at least one far-field quantity being associated with the electromagnetic waves generated by the device under test 12 based on the near-field measurements.

For example, the test system 10 may be configured to determine a far-field effective radiated power (in z-direction) of the device under test 12 based on the near-field measurements, as is explained in more detail in the following.

Generally, for electromagnetic waves generated by the device under test 12 that propagate in the z-direction, the electric field component $E_p$ (p=x or p=y) at a distance d is given by $$E_p(x, y, d) = \frac{4\pi^2}{\lambda d} e^{-i(k_0 d + \frac{\pi}{4})} \hat{E}_p(k_x = 0, k_y = 0, z = 0), \quad (E.1)$$

wherein $\hat{E}_p (k_x=0, k_y=0, z=0)$ is the plane wave spectrum of the device under test 12 at z=0 for $k_x=0$ and $k_y=0$.

The plane wave spectrum $\hat{E}_p (k_x=0, k_y=0, z=0)$ is given as in integral over the E-field in the x-y-plane at z=0, i.e.

$$\hat{E}_p(k_x=0,k_y=0,z=0)=\int dx \partial dy\, E_p(x,y,z=0). \quad (E.2)$$

This can be expressed in terms of an integral over the E-field in the x-y-plane at z=D as $$\hat{E}_p(k_x=0,k_y=0,z=0)=e^{-ik_0 \cdot D}\int dx \int dy\, E_p(x,y,z=D). \quad (E.3)$$

The far-field effective radiated power at a distance d is related to the squared absolute value of the electric field $E_p(x, y, d)$, which in turn can be calculated via equations (E.1) and (E.3).

Thus, the effective radiated power of the device under test 12 can be obtained by calculating the integral on the right hand side of equation (E.3).

The test system 10, for example the analysis circuit 16, is configured to calculate the integral on the right hand side of equation (E.3) via a quasi-Monte Carlo technique that is applied to the integral.

The antennas 20 can measure the E-field in the x-y-plane at z=D, such that a set of N measurement points $E_p(x_i, y_i, z=D)$ is obtained, wherein N is the total number of antennas 20.

The integral on the right had side of equation (E.3) can then be approximated by $$I = \frac{1}{N} \sum_{i=1}^{N} E_p(x_i, y_i, z = D).$$

The effective radiated power ERP can then be determined by the analysis circuit, as the effective radiated power is proportional to the squared absolute value of I, i.e. ERP~I·I*.

Thus, the effective radiated power is determined based on a quasi-Monte Carlo integration method that is applied to the plane wave spectrum of the device under test 12 in the (radiating) near-field area of the device under test 12.

Therein, aliasing effects are reduced due to the placement or rather locations of the antennas 20 in the x-y-plane at z=D, because the antennas 20 are arranged in an irregular fashion, for example in a quasi-random fashion.

Aliasing effects arise if the integral on the right hand side of equation (E.3) is evaluated via a Riemann sum (i.e. over an evenly spaced grid of points). Thus, by evaluating the integral via the quasi-Monte Carlo technique at quasi-random positions, these aliasing effects are reduced.

Using methods of the present disclosure, it has been discovered that the ERP can be determined with a total number of antennas 20 that is up to 60% less when compared to a grid-like arrangement of the antennas 20, without sacrificing measurement accuracy.

Certain embodiments disclosed herein utilize circuitry (e.g., one or more circuits), for example the analysis circuit, in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of manufacturing an antenna array, comprising:
   providing several antennas;
   determining at least one set of quasi-random positions for the antennas based on a predefined algorithm for limiting aliasing effects, wherein the positions are arranged on a manifold having at least one dimension in an irregular manner; and
   arranging the antennas according to the at least one set of quasi-random positions obtained from the predefined algorithm for limiting aliasing effects,
   wherein several sets of quasi-random positions are determined based on the predefined algorithm for limiting aliasing effects, and wherein one of the several sets of quasi-random positions is selected based on at least one predefined criterion.

2. The method of claim 1, wherein the predefined algorithm is established as a blue noise sampling algorithm, a Poisson disc sampling algorithm and/or as a low discrepancy sampling algorithm.

3. The method of claim 1, wherein the manifold is established as a line having a predetermined length or as a portion of a plane having a predefined area.

4. The method of claim 1, wherein the sets of quasi-random positions are respectively transformed into spatial frequency domain, thereby obtaining a spatial spectrum for each of the sets of quasi-random positions, in order to select one of the several sets of quasi-random positions.

5. The method of claim 4, wherein the predefined criterion comprises a width of a center peak of the spatial spectrum and/or a height of side peaks of the spatial spectrum.

6. The method of claim 1, wherein said arranging the antennas includes arranging the antennas such that the antennas have a common main transmission direction and/or a common main reception direction.

7. The method of claim 1, wherein a total number of the antennas is predetermined.

8. An antenna array manufactured by the method of claim 1.

9. A test system, comprising:
   a device under test configured to transmit electromagnetic waves;
   an antenna array arranged in a near-field area of the device under test, the antenna array including a plurality of antennas arranged according to a set of quasi-random positions that reduces aliasing effects, the set of quasi-random positions being selected from several sets of quasi-random positions based on at least one predefined criterion, wherein the antenna array is configured to take a set of sample measurements of the electromagnetic waves transmitted by the device under test via the plurality of antennas of the antenna array; and an analysis circuit configured to determine at least one far-field quantity of the electromagnetic waves generated by the device under test based on the set of sample measurements.

10. The test system of claim 9, wherein the analysis circuit is configured to determine the at least one far-field quantity based on a quasi-Monte Carlo method.

11. The test system of claim 10, wherein the analysis circuit is configured to determine the at least one far-field quantity based on a quasi-Monte Carlo method that is applied to a plane wave spectrum of the device under test in the near-field area of the device under test.

12. The test system of claim 10, wherein the analysis circuit is configured to determine the at least one far-field quantity based on a quasi-Monte Carlo integration method that is applied to an integral of an electric field strength of the electromagnetic waves over an area of the antenna array.

13. The test system of claim 9, wherein the at least one far-field quantity comprises a radiated power.

\* \* \* \* \*